(12) United States Patent
Lee et al.

(10) Patent No.: US 6,475,299 B1
(45) Date of Patent: Nov. 5, 2002

(54) CONVERSION COATING COMPOSITION BASED ON NITROGEN AND SILICON COMPOUNDS AND CONVERSION COATING METHOD USING THE SAME

(75) Inventors: Byong Ho Lee, Daejeon-si; Dek Gin Yang; Yang Je Lee, both of Chungcheongbuk-do; Myong Gun Chong, Chungcheongnam-do; Jae Ok Lim, Cheongju-si; Sung Wook Chun, Incheon-si; Min Eui Hong, Incheon-si; Kyu Hong An, Incheon-si, all of (KR)

(73) Assignees: Samsung Electro-Mechanics Co., Ltd., Kyungki-do (KR); SD Chemical Co., Ltd., Incheon-si (KR)

( * ) Notice: Subject to any disclaimer, the term of this patent is extended or adjusted under 35 U.S.C. 154(b) by 0 days.

(21) Appl. No.: 09/612,655

(22) Filed: Jul. 7, 2000

(30) Foreign Application Priority Data

Jul. 9, 1999 (KR) .............................................. 99-27787
Jul. 9, 1999 (KR) .............................................. 99-27788

(51) Int. Cl.$^7$ .............................. B05D 3/10; C09D 1/00; C09D 183/00; C23C 22/48
(52) U.S. Cl. ................. 148/243; 106/14.13; 106/14.41; 106/14.42; 106/14.43; 148/247; 427/96; 427/299; 427/309; 427/327; 427/353; 427/384; 427/435
(58) Field of Search ................................. 148/243, 247; 106/14.13, 14.41, 14.42, 14.43; 427/96, 299, 309, 327, 353, 384, 435

(56) References Cited

U.S. PATENT DOCUMENTS

| | | | | |
|---|---|---|---|---|
| 4,222,779 A | * | 9/1980 | Bengali et al. | 106/14.12 |
| 4,225,350 A | * | 9/1980 | Allan et al. | 106/14.12 |
| 4,225,351 A | * | 9/1980 | Zuendt et al. | 106/14.12 |
| 4,512,818 A | | 4/1985 | Valayil et al. | 252/187.23 |
| 5,011,551 A | | 4/1991 | Emeric et al. | 148/248 |
| 5,601,663 A | | 2/1997 | Rungta et al. | 148/271 |
| 5,667,599 A | | 9/1997 | Rungta et al. | 148/255 |

* cited by examiner

*Primary Examiner*—Anthony J. Green
(74) *Attorney, Agent, or Firm*—Lowe Hauptman Gilman & Berner, LLP

(57) ABSTRACT

Disclosed are a conversion coating composition for use in the surface treatment of a PCB and a conversion coating method using the same. The composition comprises 0.1–30 vol % of sulfuric acid; 0.1–15 vol % of hydrogen peroxide; 0.01–10 wt % of an organic acid; 0.1–30 wt % of a nitrogen compound; 0.01–10 wt % of an organic silicate and/or organic titanate; and 0.1–20 wt % of a film forming auxiliary, 0.1–30 wt % of an etching rate controller, 0.1–20 wt % of a reaction promoter and/or 0.1–20 g/l of a stabilizer. This composition is applied to a PCB at 10–60° C. for 1–10 min. The conversion coating film is superb in adhesive strength, acid resistance, and adhesion and can be formed with ease.

23 Claims, 13 Drawing Sheets

(11 of 13 Drawing Sheet(s) Filed in Color)

CONVERSION COATING COMPOSITION BASED ON NITROGEN AND SILICON COMPOUNDS AND CONVERSION COATING METHOD USING THE SAME

BACKGROUND OF THE INVENTION

1. Field of the Invention

The present invention relates to a conversion coating composition based on nitrogen and silicon compounds. More particularly, the present invention relates to a nitrogen and silicon compound-based conversion coating composition with excellent adhesion and acid resistance. Also, the present invention is concerned with a method for coating a printed circuit board with the conversion coating composition.

2. Description of the Prior Art

In the manufacture of multi-layer printed circuit boards (MLB), there is generally employed a black oxidizing process of inner circuits. Indispensable for the manufacture of an MLB, the black oxidizing process is conducted with the aim of protecting inner circuits and maximizing the bonding strength between inner layers and outer layers (bonding sheets, prepregs) when they are laminated.

Thus far, in the PCB industry, pretreatments, including cleaning with an alkali solution, rinsing, soft-etching, acid treating, and pre-dipping, have been taken in advance of a black oxidizing process of inner layers of an MLB to facilitate this subsequent process in which the inner circuits, consisting of copper, are oxidized black at a high temperature (70–80° C.) by use of an oxidizing agent such as sodium chlorite ($NaClO_2$) in an NaOH or KOH atmosphere.

Consisting mainly of cupric oxide (CuO), the black oxides formed as a result of such conventional blackening processes are highly vulnerable to acid to cause a serious pinkring problem. That is, when holes are formed during acid bath processes, subsequent to blackening and laminating processes, including an electroless plating process using soft-etching ($H_2SO_4/H_2O_2$), an acidic copper plating solution, and its pretreatments, the back oxides around the drilled holes are corroded by the acid used.

To circumvent this problem, the cupric oxide (CuO) layer is reduced to a cuprous oxide ($Cu_2O$) layer, which is relatively resistant to acid, on the norm. This reduced layer, even though more resistant to acid than the CuO layer, cannot be an ultimate solution because it is dissolved upon the soft etching or in an inorganic acid such as sulfuric acid, hydrochloric acid and nitrogen acid. Further, cuprous oxide ($Cu_2O$) is oxidized back to cupric oxide (CuO) at high temperatures.

In addition, the reduction of cupric oxide into cuprous oxide is achieved by use of a reducing agent such as dimethyl amine borane (DMAB), morpholine borane (MPB), formalin (HCHO), sodium borohydride ($NaBH_4$), and potassium borohydride ($KBH_4$). Of them DMAB and MPB are prevalently used because of their powerful reducing activity. However, they are very expensive and, indeed, encroach most of the expense required for the blackening process.

Besides, there are known several blackening processes that are conducted in acidic atmospheres. They suffer from the disadvantage of being very difficult to control because all are extremely sensitive to the chlorine ion concentration of the bath. Further, these blackening processes allow the black oxides to have only a peel or bond strength of less than 1 $kg/cm^2$, so that they are poor in reliability.

SUMMARY OF THE INVENTION

Therefore, it is an object of the present invention to overcome the above problems encountered in prior arts, including alkali blackening processes and acidic blackening processes, and to provide a nitrogen and silicon compound-based conversion coating composition which is capable of forming on copper or copper alloy matrices a blackish brown oxide film superb in acid resistance and adhesion.

It is another object of the present invention to provide a conversion coating composition which allows the formation of blackish brown films on a PCB without requiring the pre- and post-treatment processes otherwise indispensable for conventional blackening processes.

It is a further object of the present invention to provide a conversion coating composition which provides excellent adhesion for the lamination of a multi-layer printed circuit board.

It is still another object of the present invention to provide a conversion coating method of a PCB by which a blackish brown oxide film superior in acid resistance and adhesion conversion can be formed on a copper or copper alloy printed circuit board.

It is still a further object of the present invention to provide a conversion coating method of a PCB, which requires no pre- and post-treatments otherwise indispensable for conventional methods and thus is economically remarkably favorable in terms of procedure and production cost.

In accordance with an aspect of the present invention, there is provided a conversion coating composition, comprising 0.1–30% by volume of sulfuric acid; 0.1–1 5% by volume of hydrogen peroxide; 0.01–10% by weight of an organic acid; 0.1–30% by weight of a nitrogen compound; 0.01–10% by weight of a silica and/or organic titanate; and at least one additive selected from a film forming auxiliary, an etching rate controller, a reaction promoter and a stabilizer, with a proviso that said film forming auxiliary, said etching rate controller and said reaction promoter are used at amounts of 0.1–20% by weight, 0.1–30% by weight, and 0.1–20% by weight, respectively, based on the weight of the conversion coating composition and said stabilizer is used at an amount of 0.1–20 g/l based on the volume of the conversion coating composition.

In accordance with another embodiment of the present invention, there is provided a method for forming a conversion coating film on a printed circuit board, comprising the steps of: cleaning and rinsing a copper or a copper alloy printed circuit board; applying to the printed circuit board a conversion coating composition comprising: 0.1–30% by volume of sulfuric acid; 0.1–15% by volume of hydrogen peroxide; 0.01–10% by weight of an organic acid; 0.1–30% by weight of a nitrogen compound; 0.01–10% by weight of a silica and/or organic titanate; and at least one additive selected from a film forming auxiliary, an etching rate controller, a reaction promoter and a stabilizer, with a proviso that said film forming auxiliary, said etching rate controller and said reaction promoter are used at amounts of 0.1–20% by weight, 0.1–30% by weight, and 0.1–20% by weight, respectively, based on the weight of the conversion coating composition and said stabilizer is used at an amount of 0.1–20 g/l based on the volume of the conversion coating composition to form a conversion coating film; and cleaning and drying the printed circuit board.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other objects, features and other advantages of the present invention will be more clearly understood from the following detailed description taken in conjunction with the accompanying drawings, in which.

DETAILED DESCRIPTION OF THE INVENTION

Figure 1A:
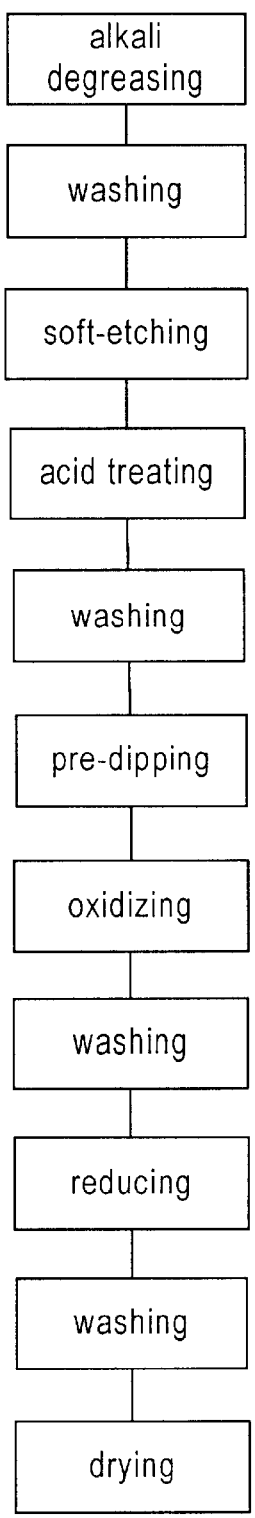
FIG. 1 shows process flows of a conventional blackening process (a) and a conversion coating process (b)
Figure 1B:
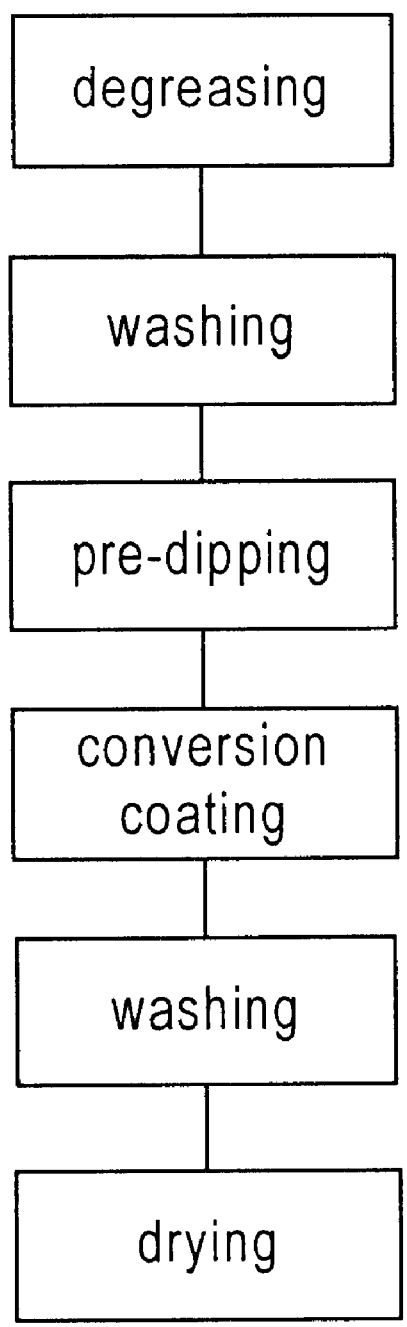

Based on nitrogen and silicon compounds which are used for the surface treatment and adhesion improvement of PCBs, the conversion coating composition that the present invention contemplates is suitable for use in the blackening of inner circuits of an MLB by virtue of excellent adhesive strength and acid resistance. In addition, the conversion coating composition brings about a great improvement in the blackening process.

The conversion coating composition (hereinafter referred to as "coating composition") for a PCB of the present invention is composed mainly of sulfuric acid, hydrogen peroxide, organic acids, and nitrogen, organic silicate and/or organic titanate. When applied for a PCB, conventional methods and chemicals result in the formation of black cupric oxide (CuO) films which are poor in acid resistance. To the contrary, when applied for a PCB, the coating composition of the present invention allows the formation of a blackish brown organic film which is superior in acid resistance and adhesive strength.

In addition, the present invention pertains to a conversion coating method in which the acid-based conversion coating composition is used to form a conversion coating film on a PCB.

When the conversion coating composition of the present invention is applied to a copper or copper alloy substrate, sulfuric acid and hydrogen peroxide not only maintain acidity of the composition, but also act to etch the copper or copper alloy substrate. Driven by this etching action, the adhesion of the nitrogen and the organic silicate and/or organic titanate to the copper or copper alloy substrate is conducted to create a blackish brown film. In this regard, the sulfuric acid, organic acids, and hydrogen peroxide together have the secondary action of enlarging the cohesion of the film formed, enhancing the adhesive forces, and intensifying the color expression of the coating film.

In the coating composition for a PCB, sulfuric acid, when it is 98% in concentration, amounts to 0.1–30% by volume and preferably 1.5–15% by volume. For example, if sulfuric acid is used at an amount of less than 0.1% by volume, it is difficult to form a coating film. On the other hand, if sulfuric acid is used at an amount of more than 30% by volume, the coating film is not dense and uniform in texture.

Hydrogen peroxide, when it is 35% in concentration, is used at an amount of 0.1–15% by volume and preferably 1.0–10% by volume based on the total volume of the coating composition. When the amount of hydrogen peroxide is below 0.1% by volume, it is difficult to obtain a coating film. On the other hand, when it is over 15% by volume, the coating composition is too active in etching potential against copper to obtain a uniform coating film and the coating film, even if formed, may be dissolved.

Organic acid is added at an amount of 0.01–10% by weight based on the total weight of the coating composition, preferably at an amount of 0.01–5% by weight and more preferably at an amount of 0.05–2.5% by weight. If organic acid amounts to less than 0.01% by weight of the coating composition, its effect is not expressed. On the other hand, if organic acid amounts to larger than 10% by weight of the coating composition, the coating film is poor in cohesion.

As a suitable organic acid in the present invention, carboxylic acids which contain at least one —COOH group may be used alone or in combination. Their anhydrides may be also used. Examples of organic acid include acetic acid, propionic acid, glycolic acid, citric acid, tartaric acid, maleic acid, malonic acid, succinic acid, phthalic acid, benzoic acid and acrylic acid with preference to glycolic acid and phthalic acid.

The amount of nitrogen compounds falls within the range of 0.1–30% by weight based on the total weight of the coating composition, preferably within the range of 0.1–20% by weight, and more preferably within the range of 0.5–15% by weight. Less than 0.1% by weight of nitrogen compounds makes the coating film too thin. On the other hand, if nitrogen compounds are present at an amount of greater than 30% by weight, the coating film is thickly formed with weak adhesion.

As nitrogen compounds suitable in the present invention, urea derivatives, thio-urea derivatives, nitrogen-containing hetero ring compounds, such as imidazole, triazole, thiazole and derivatives thereof, and compounds containing active nitrogens such as —NH, —N=, =NOH, —N=N—, and =N—S—N=, may be used alone or in combination thereof. Preferable is triazole.

Organic silicate and/or organic titanate, alone or in combination, are used at an amount of 0.01–10% by weight based on the total weight of the coating composition and preferably at an amount of 0.1–5.0% by weight. Less than 0.01% by weight of organic silicate and/or organic titanate makes the coating layer weak in self-cohesion while greater than 10% by weight of organic silicate and/or organic titanate deteriorates the stability of the coating composition.

Suitable as organic silicate and/or organic titanate for use in the present invention are organic silane compounds containing an —Si—O— group, titanate coupling agents containing a —Ti—O— group, and mixtures thereof. By way of examples, and not limitation, organic silicate and/or organic titanate suitable for use in the present invention include $RSi(OR)_3$, $RSi(OROR)_3$, $Ti(OC_3H_7)_4$, and $N(CH_2CH_2O)_3TiOC_3H_7$ (wherein R is alkyl, vinyl, benzyl, or acetyl).

In addition, additives may be used to bring about an improvement in the reactivity of the coating composition and in the reliability of the coating film.

Suitable for use for this purpose are an auxiliary for forming uniform color coating films (hereinafter referred to as "film forming auxiliary"), an agent for controlling the etching rate against copper, which is a driving force for the coating reaction (hereinafter referred to as "etching rate controller"), an agent for promoting the reaction of the coating composition and the formation of the coating film (hereinafter referred to as "reaction promoter"), and a stabilizer.

Suitable as the film forming auxiliary are hydroquinone, resorcinol, pyrocatechol, pyrogallol, derivatives thereof, and organic sulfur compounds. Preferable is resorcinol. As for organic sulfur compounds, they are preferably sulfides containing active sulfur such as —S—, —S—S—, —S—S—S—, R—S—, R—SH, R=S, and R—S— (wherein R is carbon- or nitrogen-containing radicals) and more preferably sulfides containing nitrogen. A representative example is $(CH_3)_2NCS_2(CH_2)_3SO_3Na$. Such compounds may be used alone or in combination.

The film forming auxiliary is added at an amount of 0.1–20% by weight based on the total weight of the coating composition, preferably at an amount of 0.1–15% by weight, and more particularly at an amount of 0.5–10% by weight. For example, when the film forming auxiliary is used at an amount of less than 0.1% by weight, its effect is expressed only at a trace degree. On the other hand, greater than 20% by weight of the film forming auxiliary acts as a barrier against film formation or lowers the bonding strength of the coating film.

The etching rate controller is exemplified by N-methyl-2-pyrrolidone, N-cyclohexyl-2-pyrrolidone, 2-pyrrolidone, dimethyl formamide, dimethyl acetamide, tetrahydrofuran, acetonitirile, dioxane, alkyl lactate, alkyl glycolate, alkyl phosphate, ketone and alcohol. These compounds may be used alone or in combination.

Based on the weight of the coating composition, the etching rate controller is used at an amount of 0.1–30% by weight, preferably at an amount of 0.1–20% by weight, and more preferably at an amount of 0.5–10% by weight. For instance, if used at less than 0.1% by weight, the etching rate controller cannot perform its function. On the other hand, greater than 30% by weight of the etching rate controller results in a remarkable reduction in the solubility of the copper etched.

Suitable as the reaction promoter is the compound which is selected from the group consisting of persulfates such as ammonium peroxysulfate, sodium peroxysulfate and potassium peroxysulfate; monosulfates such as sodium peroxymonosulfate and potassium peroxymonosulfate; nitrates such as nitric acid, sodium nitrate, potassium nitrate, and ammonium nitrate; phosphoric acid or phosphates; trivalent iron salts such as ferric nitrate, ferric sulfate, and ferric citrate; and mixtures thereof.

The amount of the reaction promoter in the coating composition ranges from 0.1 to 20% by weight, preferably from 0.1 to 15% by weight and more preferably from 0.5 to 10% by weight. For example, if the reaction promoter is used at less than 0.1% by weight, its addition effect is next to trivial. On the other hand, if too much the reaction promoter is used, the coating film is so vague in color on the whole that a uniform color is difficult to obtain.

Chelating agents such as nitrilotriacetic acid (NTA), EDTA, DPTA and metal salts thereof are useful as the stabilizer. On the basis of the volume of the coating composition, the stabilizer is used at an amount of 0.1–20 g/l and preferably at an amount of 0.5–5 g/l. When the stabilizer is used at an amount of less than 0.1 g/l, it can hardly protect hydrogen peroxide. On the other hand, when the amount of the stabilizer exceeds 20 g/l, the copper etching rate is remarkably lowered.

The coating composition of the present invention is prepared by mixing the components at their respective predetermined amounts and, if necessary, by adding water to the final weight of 100%. In the coating composition, the organic acid, the nitrogen compound, the organic silicate and/or organic titanate, and the additive selected from the film forming auxiliary, the etching rate controller, the reaction promoter, the stabilizer, and mixtures thereof preferably amount together to 50% by weight or less.

Unnecessary to undergo a soft-etching step, an acid treatment step and a reducing step, all of which are necessary for conventional blackening processes of MLB, the inner circuits can be directly used as substrates for the coating composition of the present invention. Necessary for the inner circuits are only cleaning and washing. When coated on the inner circuits, the coating composition of the present invention is converted into a blackish brown film with excellent acid resistance and adhesive strength.

Before being coated with the coating composition of the present invention, the target surface of a PCB is degreased (cleaned) and rinsed. This degreasing, which is usually used in forming conversion coating films, is carried out to remove residues of the previous step (D/F), impurities, and fingerprints.

After being rinsed, the PCB may be pre-dipped in a pre-dip composition. The pre-dip composition is made more dilute than the coating composition and leads the copper surface to activation large enough to form a conversion coating film. As a result, the copper surface is conditioned to promote a fundamental coating reaction and to readily form a uniform coating film. Consequently, the pre-dipping process has functions of rinsing, conditioning, catalyzing and activating.

To this end, the pre-dip composition comprises sulfuric acid, hydrogen peroxide, an organic acid, a nitrogen compound, a silica and/or organic titanate, either or both of a reaction promoter and a stabilizer, and water. As recognized, the pre-dip process is nothing but a pre-treatment for the formation of conversion coating films on a PCB and may take advantage of the same components as used in the conversion coating composition, but at lower amounts.

Based on the total volume of the pre-dip composition, sulfuric acid is added at an amount of 0.1–5.0% by volume and preferably at an amount of 0.1–1.0% by volume while the amount of hydrogen peroxide falls within the range of 0.1–10.0% by volume and preferably within the range of 0.1–5.0% by weight. For example, when either of sulfuric acid and hydrogen peroxide is added at an amount of 0.1% by volume, desired effects cannot be obtained. On the other hand, greater than 5.0% by volume of sulfuric acid or greater than 10.0% by volume of hydrogen peroxide causes the copper to be etched.

For the pre-dip composition, an organic acid, a nitrogen compound, a silica and/or organic titanate, a reaction promoter and a stabilizer are used in the same amount range as in the coating composition. The total amount of these components are preferably 10% by weight or less of the pre-dip composition.

When being diluted to one fifth of the concentration of the coating composition, the pre-dip composition comprising at least one selected from the group consisting of an organic acid, a nitrogen compound, a silica and/or organic titanate, a reaction promoter and a stabilizer is found to bring about the best pre-dip effect.

The pre-dipping is carried out at 10–60° C. for about ten sec. to ten min. As mentioned previously, the pre-dipping process activates the copper surface to facilitate an initial coating reaction. If the pre-dipping process is omitted, the formation of a conversion coating film is conducted at a low rate.

After the pre-dipping, a washing process may be taken. However, it is not desirable. Thereafter, the conversion coating composition of the present invention is applied to the PCB to form a conversion coating film on the board.

The conversion coating film forming process is conducted at 10–60° C. and preferably at 30–50° C. for 1–10 min and preferably for 2–5 min by spraying the conversion coating composition onto the PCB or by dipping the PCB in the conversion coating composition. For example, at a temperature of less than 10° C., the conversion coating film is poorly formed with low adhesion. On the other hand, a temperature exceeding 60° C. causes the copper to be excessively etched, degrading the coating film in terms of uniformity.

After completion of the formation of a conversion coating film, the PCB is subjected to usual washing and drying processes. The washing process is carried out in a three-step manner with hot-rinsing as the first step. Afterwards, the PCB is sufficiently dried at about 110° C. for 30 min in order for remaining moisture or air not to act as a defect like a laminate void to expand the board upon lamination.

By way of example, and not limitation, the conversion coating composition and conversion coating method of the present invention may be applied for surface treatment of copper or copper alloy boards, laser drilling, roll coating, adhesion of dry films, adhesion improvement of printed circuit ink or thermosetting ink.

A better understanding of the present invention may be obtained in light of the following examples which are set forth to illustrate, but are not to be construed to limit the present invention.

EXAMPLE I

After being degreased with HD250™ (alkali degreasing agent) at 50° C. for 3 min and washed, copper foil pieces and laminate core specimens (20×30 cm) were pre-dipped in a pre-dip composition at 25° C. for 1 min and then dipped in conversion coating compositions prepared as indicated in Tables 1a, 2a and 3a, below. The pre-dip composition used through the following Examples comprised 5 ml/l sulfuric acid, 30 ml/l hydrogen peroxide, 1 g/l phosphoric acid, 0.1 g/l acetic acid, 10 g/l benzotriazole, 3 g/l organic titanate, and a balance amount of water.

The copper foil pieces and the laminate core specimens, on which coating films were formed, were washed, dried at 100° C. for 30 min, and laminated under the following conditions.

| Lamination Conditions | |
|---|---|
| Prepreg 1080 (polyfunctional epoxy resin 140° C. Tg) Two sheets | |
| Pressure | 30 kg/cm² |
| Temp. | 185° C. |
| Time Period | 170 min. |

Meanwhile, the copper foil pieces and the laminate core specimens, which had conversion coating films formed thereon, were measured for appearance, adhesive strength and solder shock.

The appearance of the PCB was observed with the naked eye.

For the determination of the adhesive strength, a test was conducted according to JIS standard C 6481. A coated copper thin film (CCL film) was laminated along with an inner layer sheet (CCL film) and two sheets of prepreg (1080). A tape having 1 cm width was attached to the resulting laminated body, followed by etching the copper thin film. Then, the etched laminate was cut to the length of 10 cm in the direction of the tape but 1 cm distant from both edges of the tape remaining unetched. After the tape was removed and the copper film was peeled off at a right angle to the distance of 4 cm. Adhesive strength was measured.

A test according to MIL, JIS standards was conducted for the solder shock. In 260° C. and 288° C. baths containing fused solder, laminated specimens and finally finished circuit boards were dipped for 20 sec (1 cycle, 260° C.: JIS C6481 5.5) and 10 sec (1 cycle, 288° C.: MIL-S-13949H), respectively. After being subjected to micro section, the samples were observed to determine whether delamination and/or laminate voids occurred in the samples or not.

EXAMPLE II

In this example, an examination was made of the effect of conversion coating treatment temperatures on the formation of blackish brown oxide films.

In a conversion coating composition which was prepared as indicated in Table 1a, below, copper foil pieces and laminate core specimens, which had been degreased and pre-dipped as described in Example I, were dipped at 25° C., 30° C., and 40° C., to form conversion coating oxide films. During the dipping, the coating composition was stirred at a speed of about 0.1 m/sec. The results are given in Table 1b, below.

TABLE 1a

| Conversion Coating Composition | |
|---|---|
| Components | Compositions |
| Sulfuric acid (98%) | 50 ml/l |
| Nitric acid (60%) | 5 g/l |
| Propionic acid | 10 g/l |
| Hydrogen peroxide (35%) | 45 ml/l |
| 1,2,3-Benzotriazole | 30 g/l |
| Tetraisopropyl titanate | 10 g/l |

TABLE 1b

| | 25□ | 30□ | 35□ | 40□ |
|---|---|---|---|---|
| Appearance | Dark brown | Dark brown | Reddish brown | Reddish brown |
| Adhesive Strength | 1.0 kg/cm² | 1.1 kg/cm² | 1.3 kg/cm² | 1.4 kg/cm² |
| Heat Shock | | | | |
| Delamination | None | None | None | None |
| Laminate Void | None | None | None | None |

As recognized from Table 1b, the temperature range of 30–50° C. secured the formation of blackish brown conversion coating oxide films of sufficient adhesive strength without causing delamination and laminate voids.

EXAMPLE III

In this example, an examination was made of the effect of the conversion coating treatment period of time on the formation of blackish brown oxide films.

In a conversion coating composition which was prepared as indicated in Table 2a, below, samples, which had been pre-treated as described in Example I, were dipped for 1, 2, 3 and 4 min to form conversion coating oxide films. During the dipping, the coating composition was maintained at 35° C. with stirring at a speed of about 0.1 m/sec. The results are given in Table 2b, below.

TABLE 2a

Conversion Coating Composition

| Components | Composition |
|---|---|
| Sulfuric acid (98%) | 50 ml/l |
| Phosphoric acid (70%) | 4 g/l |
| Citric acid | 8 g/l |
| Hydrogen peroxide (35%) | 40 ml/l |
| 1-H-benzotriazole | 30 g/l |
| Tetraisopropyl titanate | 5 g/l |

1. DPS: Product of RASCHIG AG (organic thio compound)

TABLE 2b

| | 1 min | 2 min | 3 min | 4 min |
|---|---|---|---|---|
| Appearance | Dark brown | Reddish brown | Reddish brown | Reddish brown |
| Adhesive Strength Heat Shock | 0.8 kg/cm$^2$ | 1.1 kg/cm$^2$ | 1.3 kg/cm$^2$ | 1.4 kg/cm$^2$ |
| Delamination | None | None | None | None |
| Laminate Void | None | None | None | None |

As seen in Table 2b, when the conversion coating process was conducted for 2–5 min, blackish brown oxide films with sufficient adhesive strength were formed and no delamination and laminate voids were found.

EXAMPLE IV

In this example, an examination was made of the stirring effect of the conversion coating composition on the formation of blackish brown oxide films.

In a conversion coating composition which was prepared as indicated in Table 3a, below, samples, which had been pre-treated as described in Example I, were dipped while the conversion coating composition was stirred at speeds of 0.1 m/s and 0.2 m/s. During the dipping, the coating treatment was carried out at 35° C. for 3 min. The results are given in Table 3b, below.

TABLE 3a

Conversion Coating Composition

| Components | Compositions |
|---|---|
| Sulfuric acid (98%) | 45 ml/l |
| Phosphoric acid (70%) | 5 g/l |
| Acetic Acid | 1 g/l |
| Hydrogen peroxide (35%) | 40 ml/l |
| 1.2.3-benzotriazole | 40 g/l |

TABLE 3b

| | Stagnant | Stirring (0.1 m/s) | Stirring (0.2 m/s) |
|---|---|---|---|
| Appearance | Reddish brown | Reddish brown | Reddish brown |
| Adhesive Strength Heat Shock | 1.3 kg/cm$^2$ | 1.3 kg/cm$^2$ | 1.2 kg/cm$^2$ |
| Delamination | None | None | None |
| Laminate Void | None | None | None |

Data of Table 3b shows that the stirring of the coating composition has no influence on the formation of blackish brown oxide films. Therefore, the coating composition guarantees the formation of blackish brown oxide films which possess sufficient adhesive strength and are freed from delamination and laminate voids.

EXAMPLE V

A comparison was made between the conversion coating composition of the present invention and conventional conversion coating compositions in regard to adhesive strength. For this, conversion coating films were respectively prepared from the conversion coating composition of the present invention and conventional ones and the laminated printed circuit boards were measured for adhesive strength in the same manner as in Example I. Of course, the boards were pre-treated as described in Example I. The pre-dip composition and the conversion coating were prepared as indicated in Examples I and III, Pre-dipping treatment was carried out at 20–30° C. for 1 min while the conversion coating treatment was carried out at 40° C. for 3 min. The reduction treatment with DMAB and MB followed conventional blackening treatment techniques. The test results are given in Table 4, below.

TABLE 4

| Co. film Thick. | Conversion coating Treatment (3 min) 35☐ | Conventional (DMAB) 35☐ | Conventional (MB) 35☐ |
|---|---|---|---|
| 1 | 1.35 | 1.20 | 1.20 |
| 2 | 1.35 | 1.24 | 1.14 |
| 3 | 1.27 | 1.09 | 1.15 |
| 4 | 1.32 | 1.24 | 1.18 |
| 5 | 1.27 | 0.98 | 1.00 |
| 6 | 1.39 | 1.27 | 1.12 |
| 7 | 1.24 | 1.13 | 1.10 |
| 8 | 1.25 | 1.02 | 1.14 |
| 9 | 1.24 | 1.31 | 1.12 |
| 10 | 1.29 | 1.04 | 1.10 |
| 11 | 1.37 | 1.05 | 1.23 |
| 12 | | 1.10 | 1.10 |
| 13 | | 0.99 | 1.16 |
| 14 | | 1.24 | 1.22 |
| 15 | | 1.03 | 1.18 |
| 16 | | 1.05 | 1.15 |
| Max. | 1.37 | 1.27 | 1.23 |
| Min. | 1.24 | 0.98 | 1.00 |
| Avg. | 1.304 | 1.124 | 1.143 |

It is apparent from Table 4 that the composition and method of the present invention can bring about an improvement in the adhesive strength of the oxide films.

EXAMPLE VI

Conversion coating films were formed according to the present invention and measured for chemical resistance.

For this, pre-dipping was conducted at 20–30° C. for 1 min in the pre-dip composition prepared in Example I. The conversion coating treatment was carried out at 24° C., for 3 minutes 32° C. for 3.5 min, 32° C. for 4 min, and 28° C. for 5 min using the conversion coating composition prepared in Example III (KR-2) to form oxide films.

Printed circuit boards on which the oxide films were formed were immersed for one hour in a neutralizing bath, a 98% sulfuric acid solution and a 35% hydrochloric acid solution.

Figure 2:
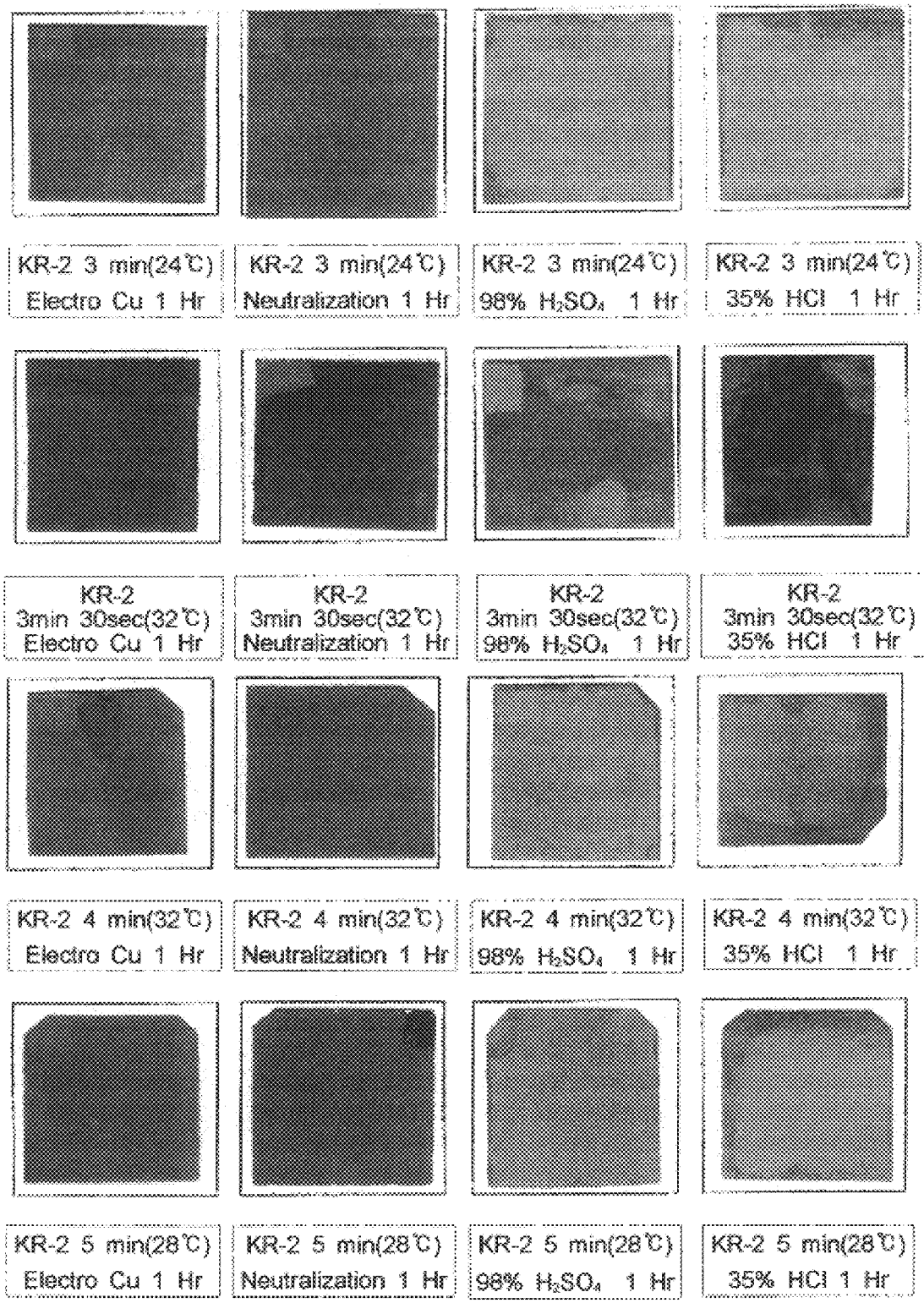
FIG. 2 is a photograph showing the excellent chemical resistance of oxide films formed according to the present invention.
Figure 3A:
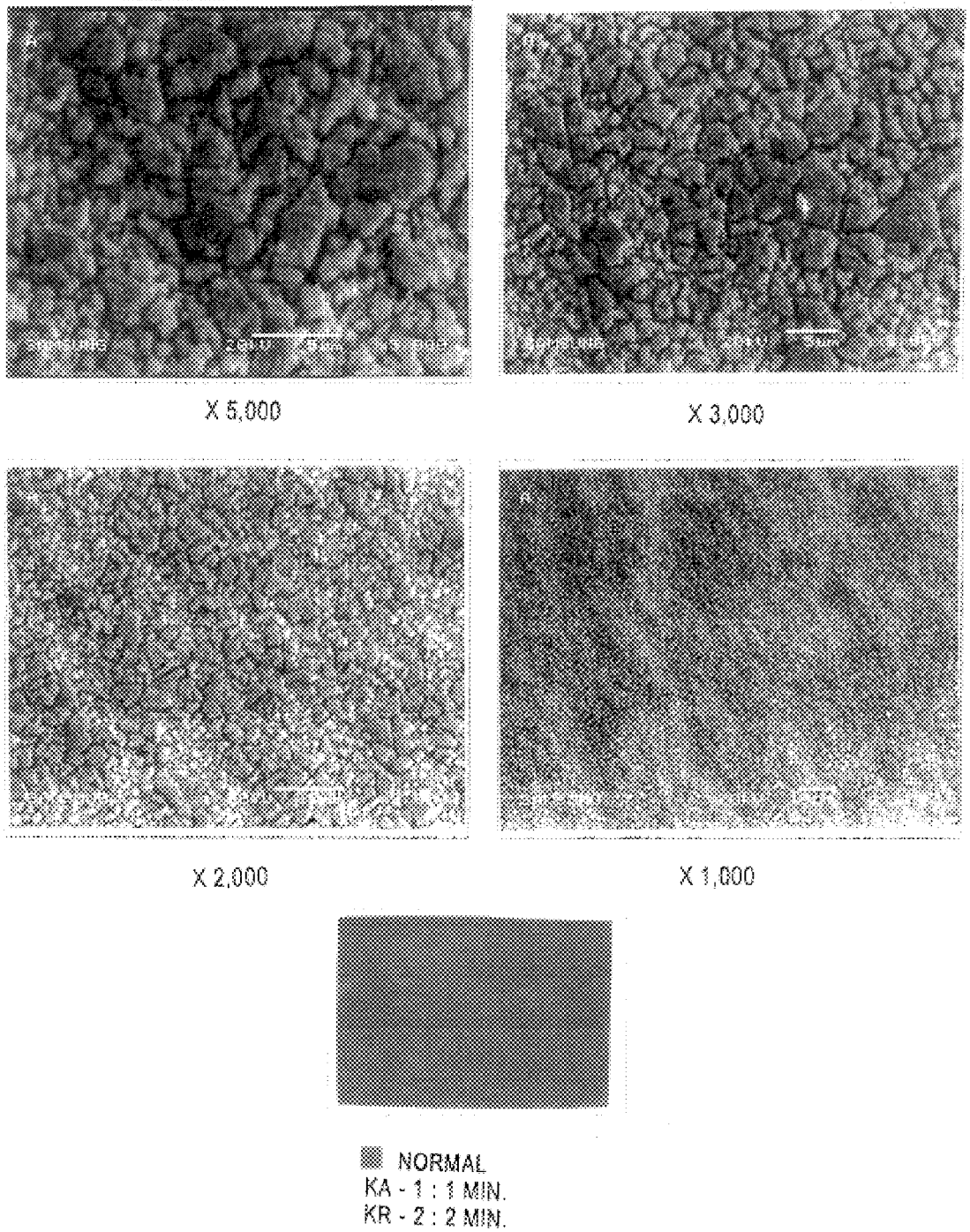
FIGS. 3a to 3j are photographs showing surface roughness conditions of PBCs treated according to the conversion coating method of the present invention.
Figure 3B:
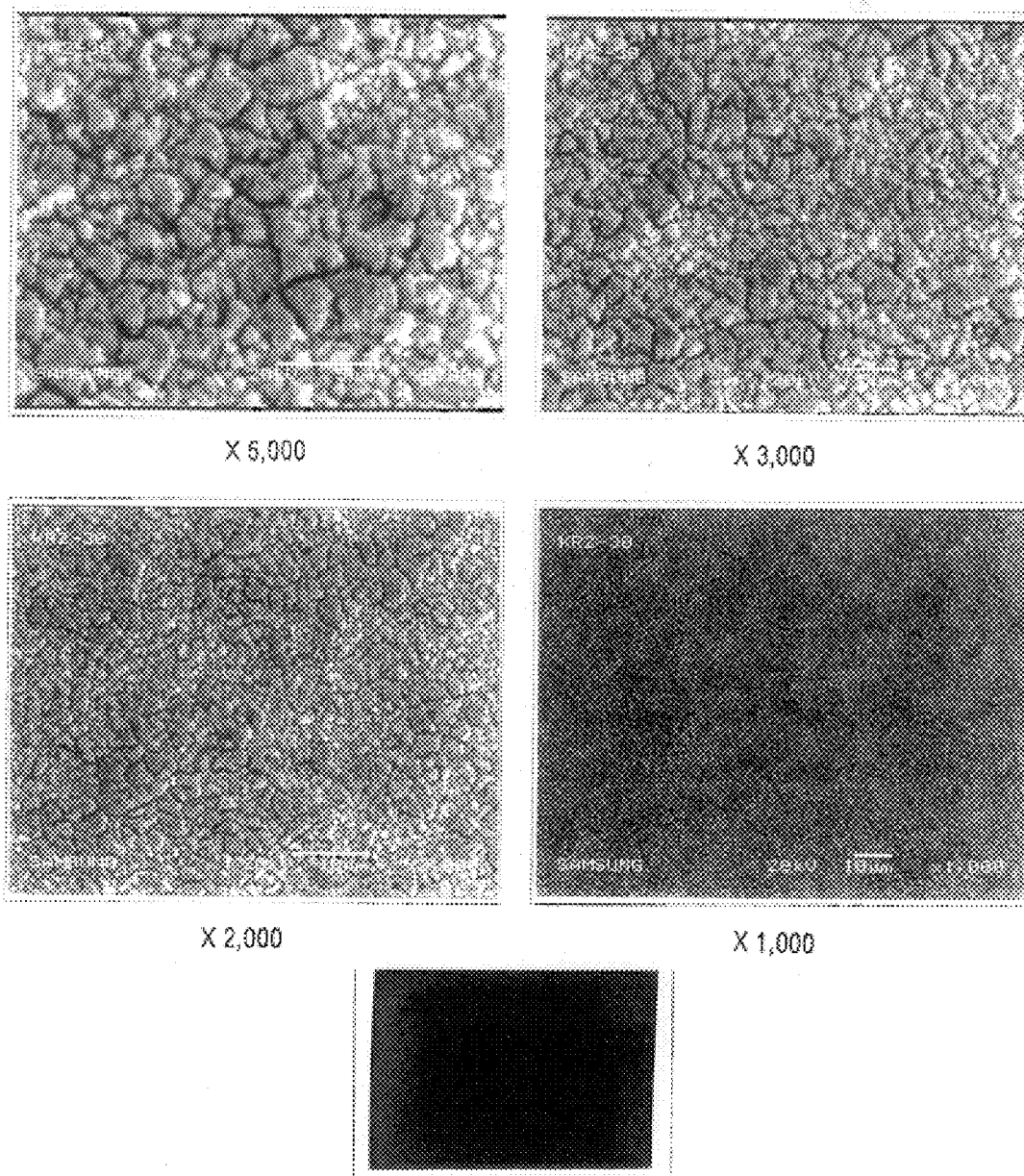
Figure 3C:
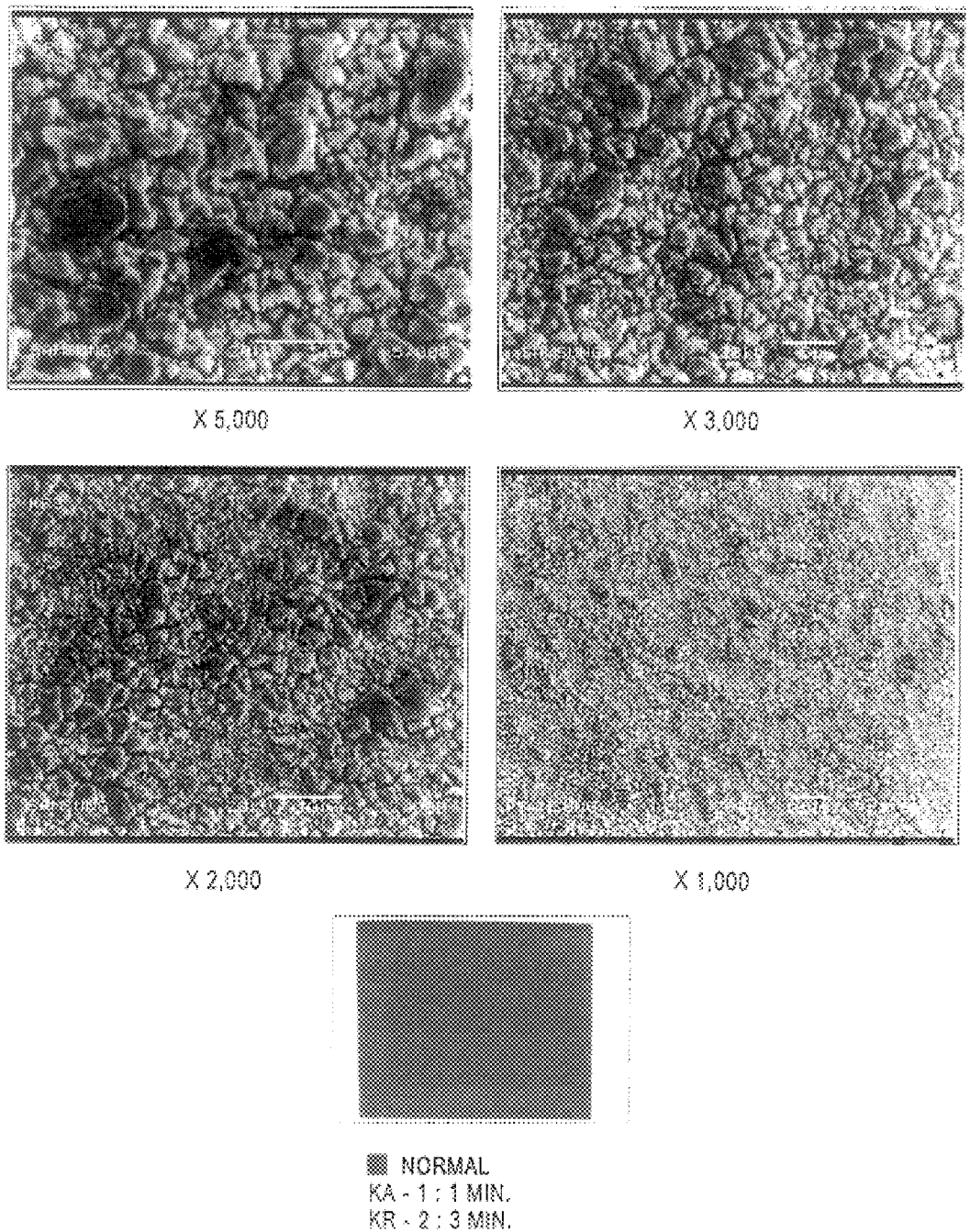
Figure 3D:
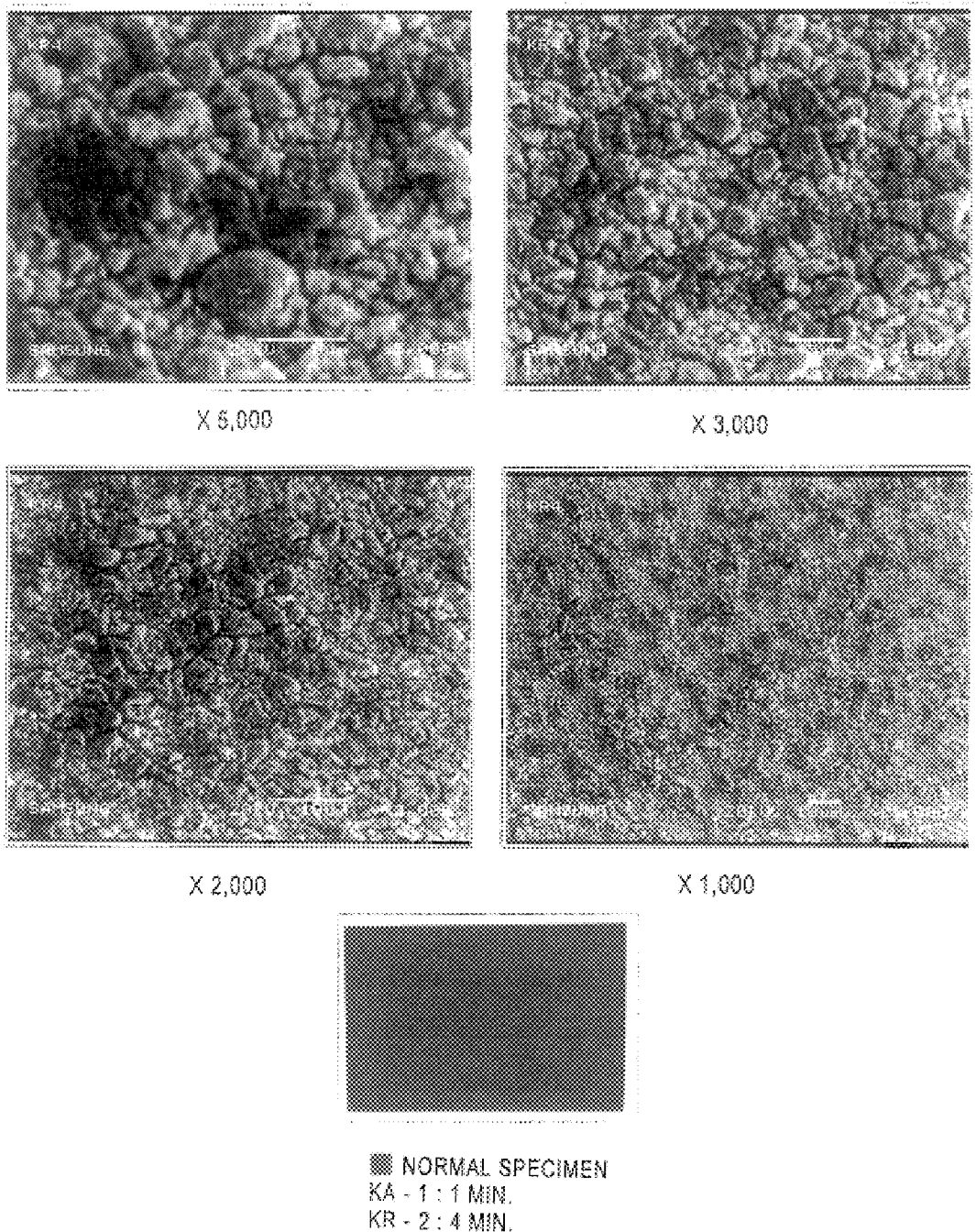
Figure 3E:
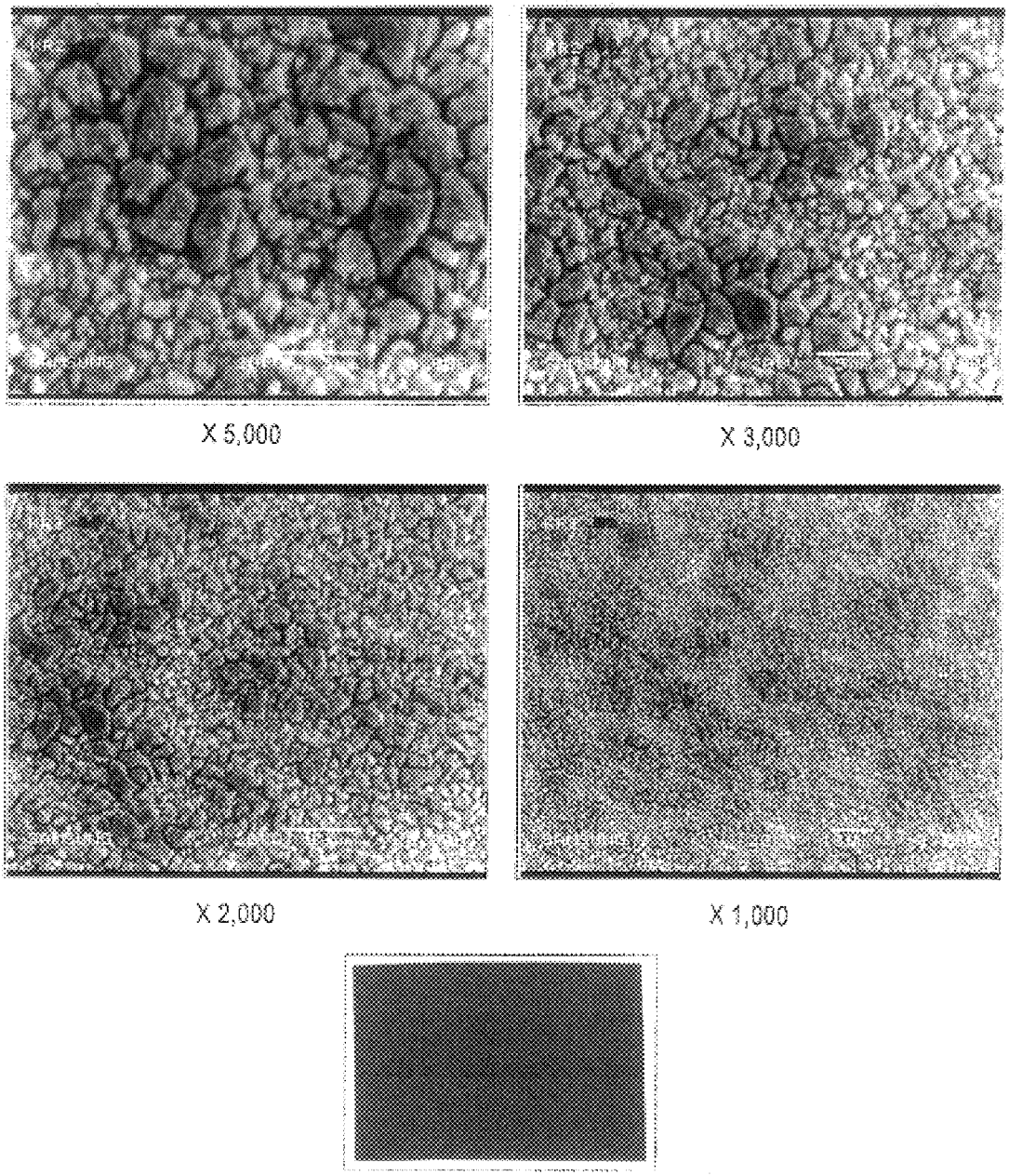
Figure 3F:
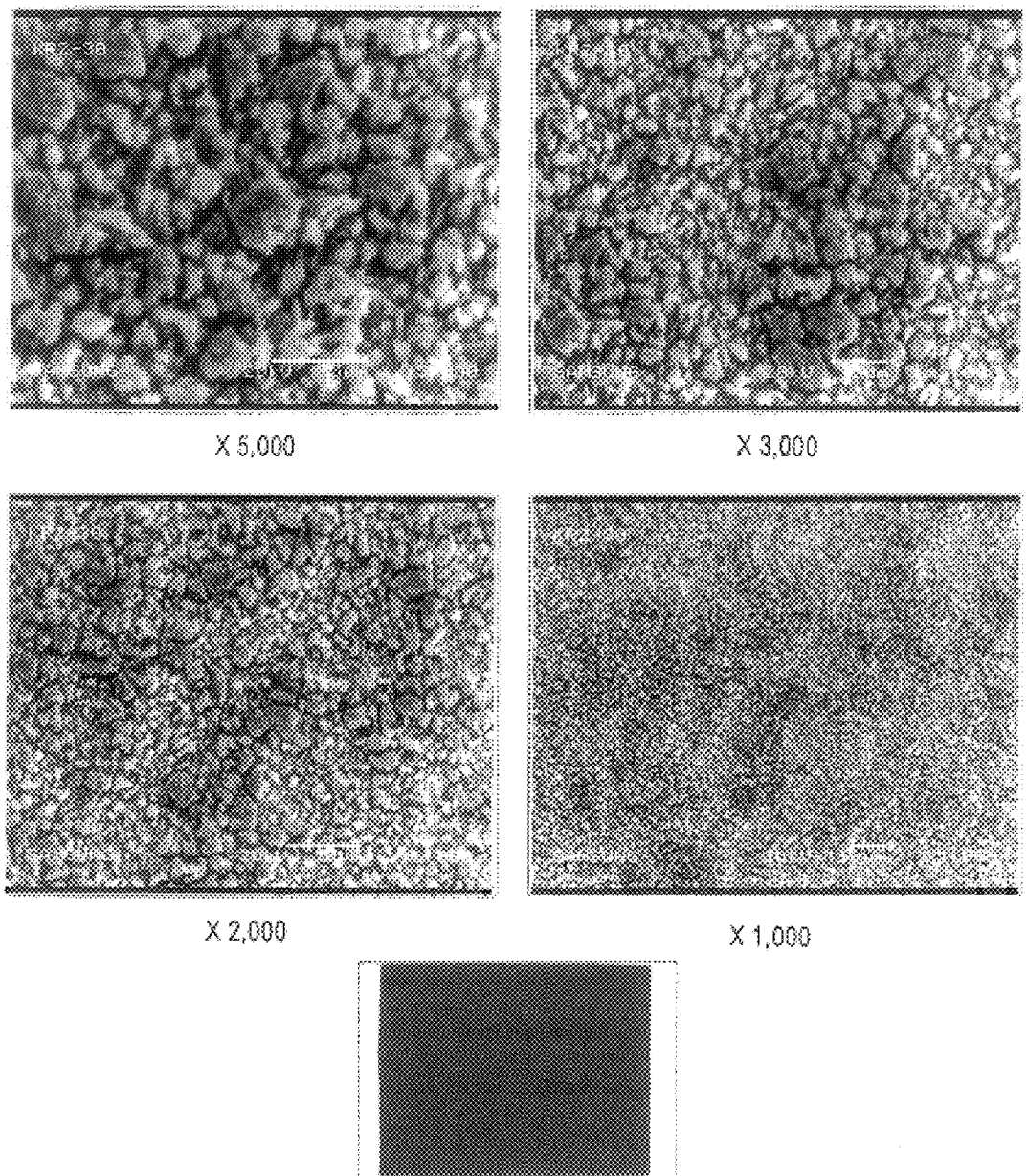
Figure 3G:
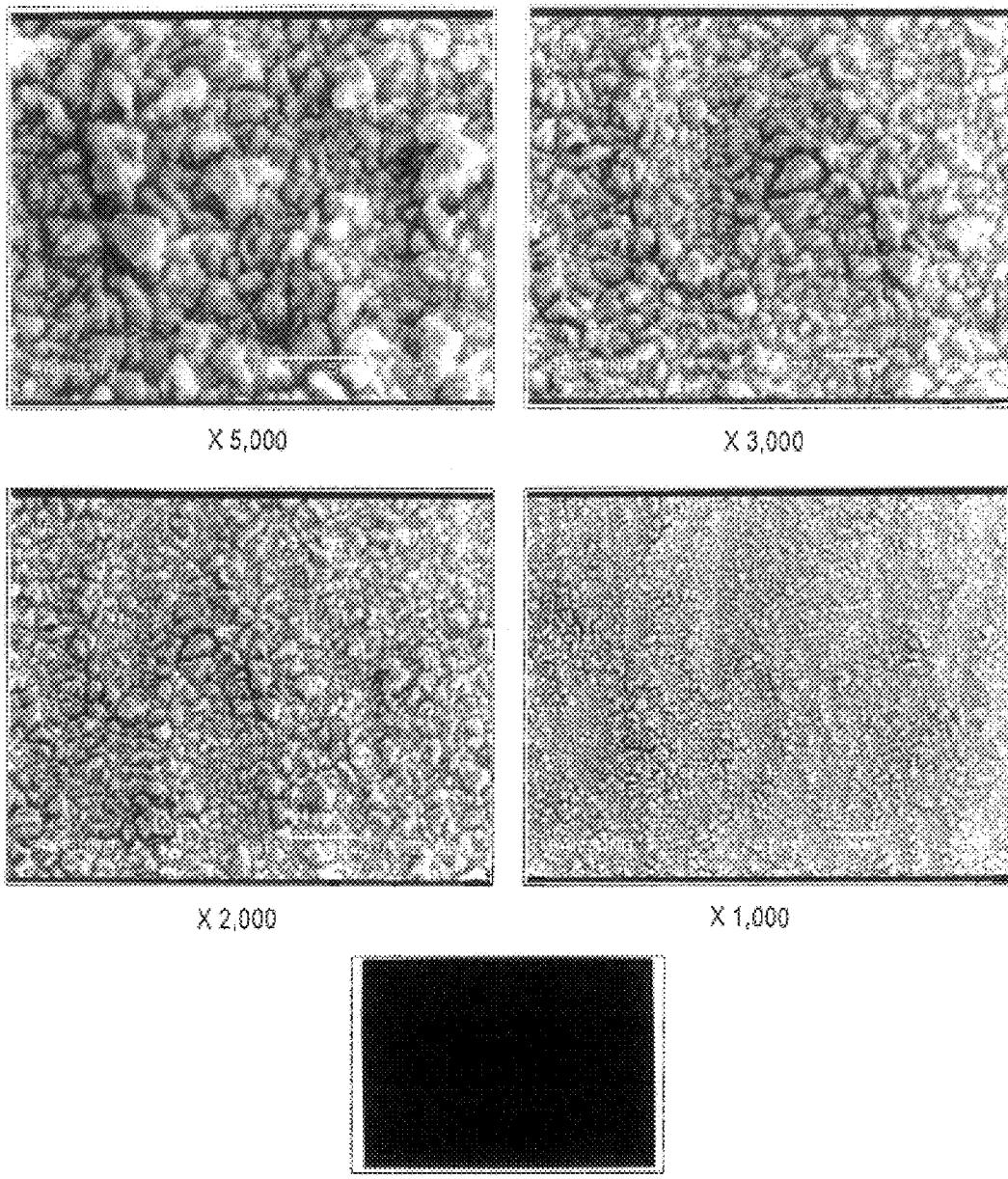
Figure 3H:
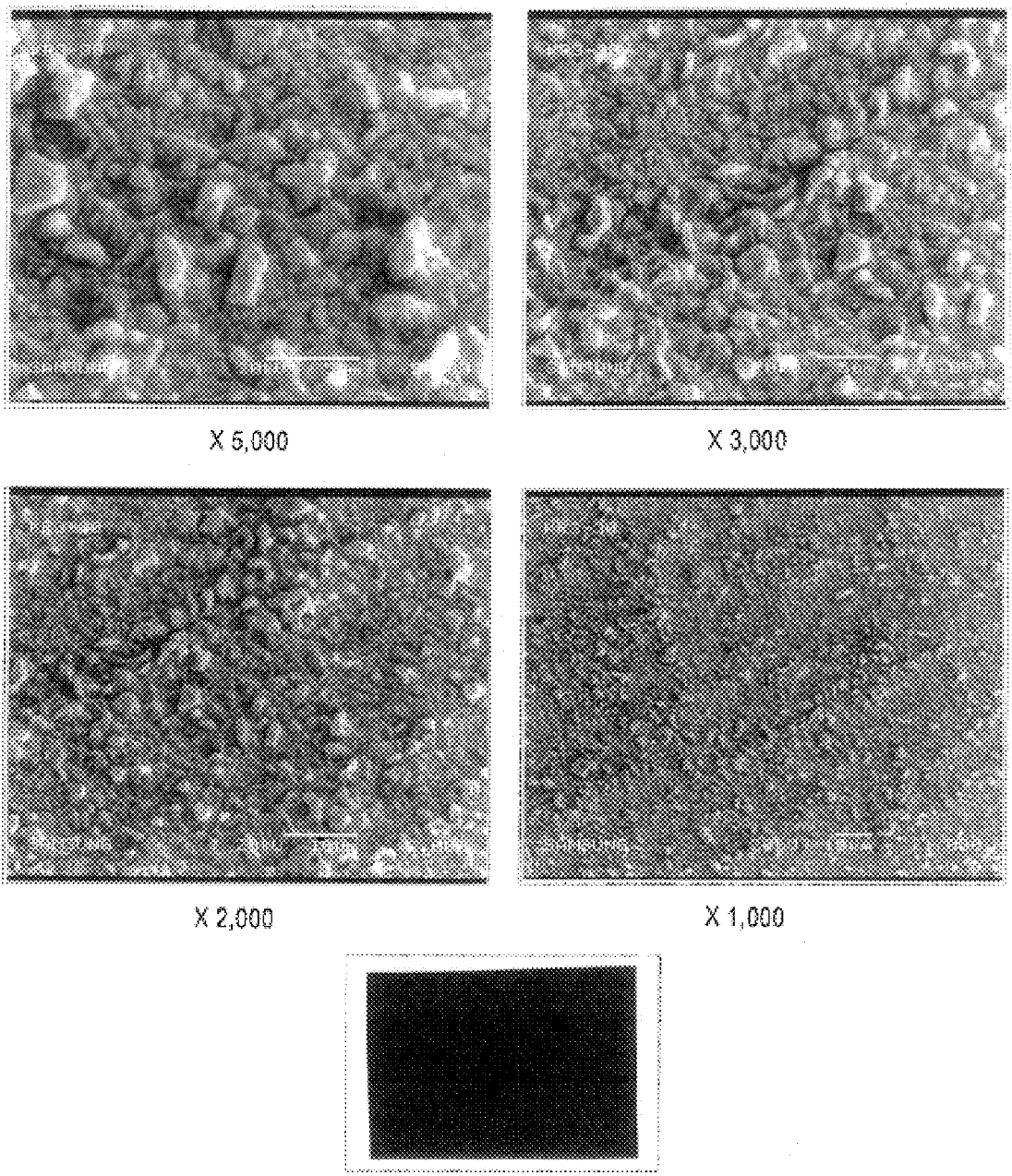
Figure 3I:
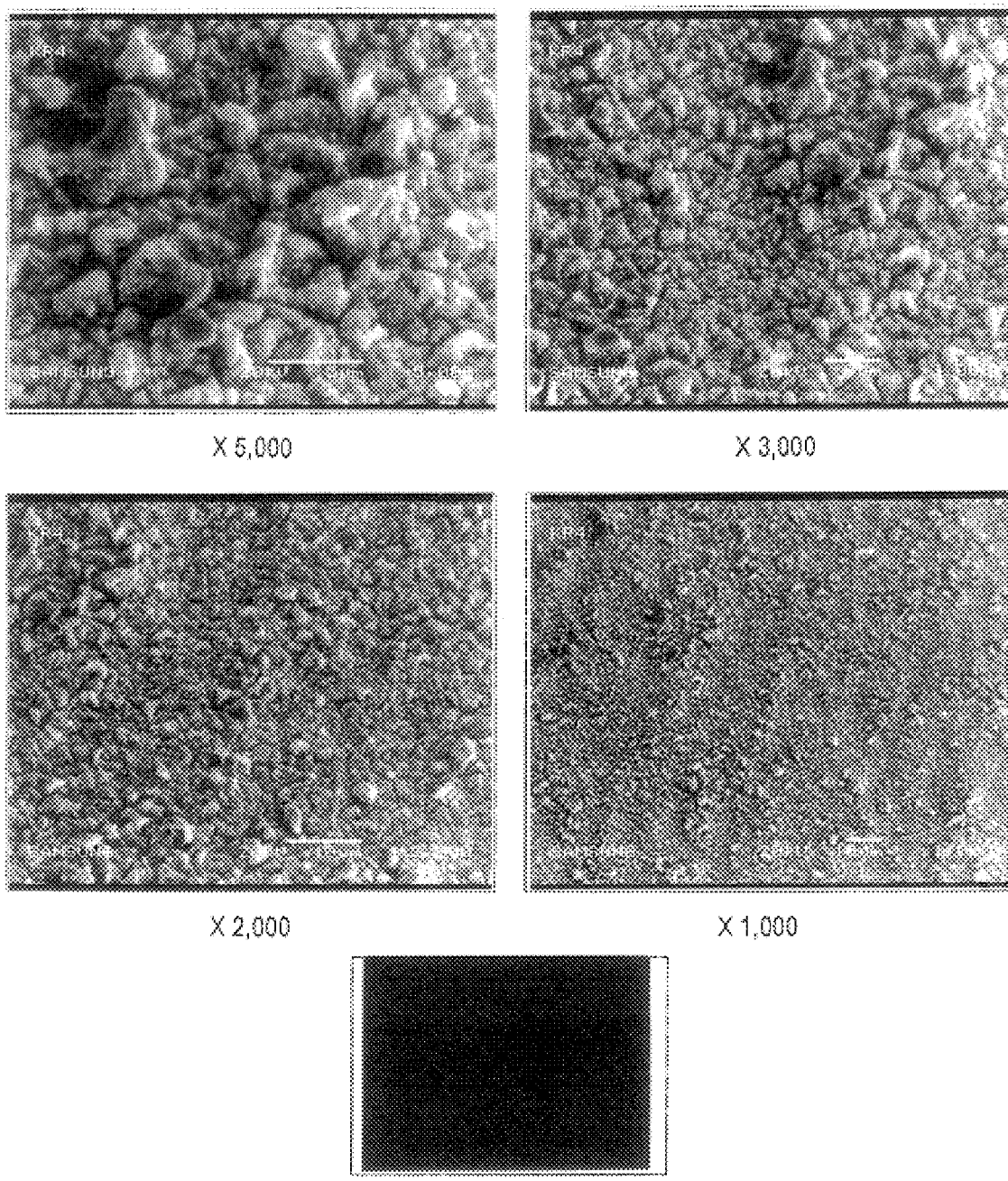
Figure 3J:
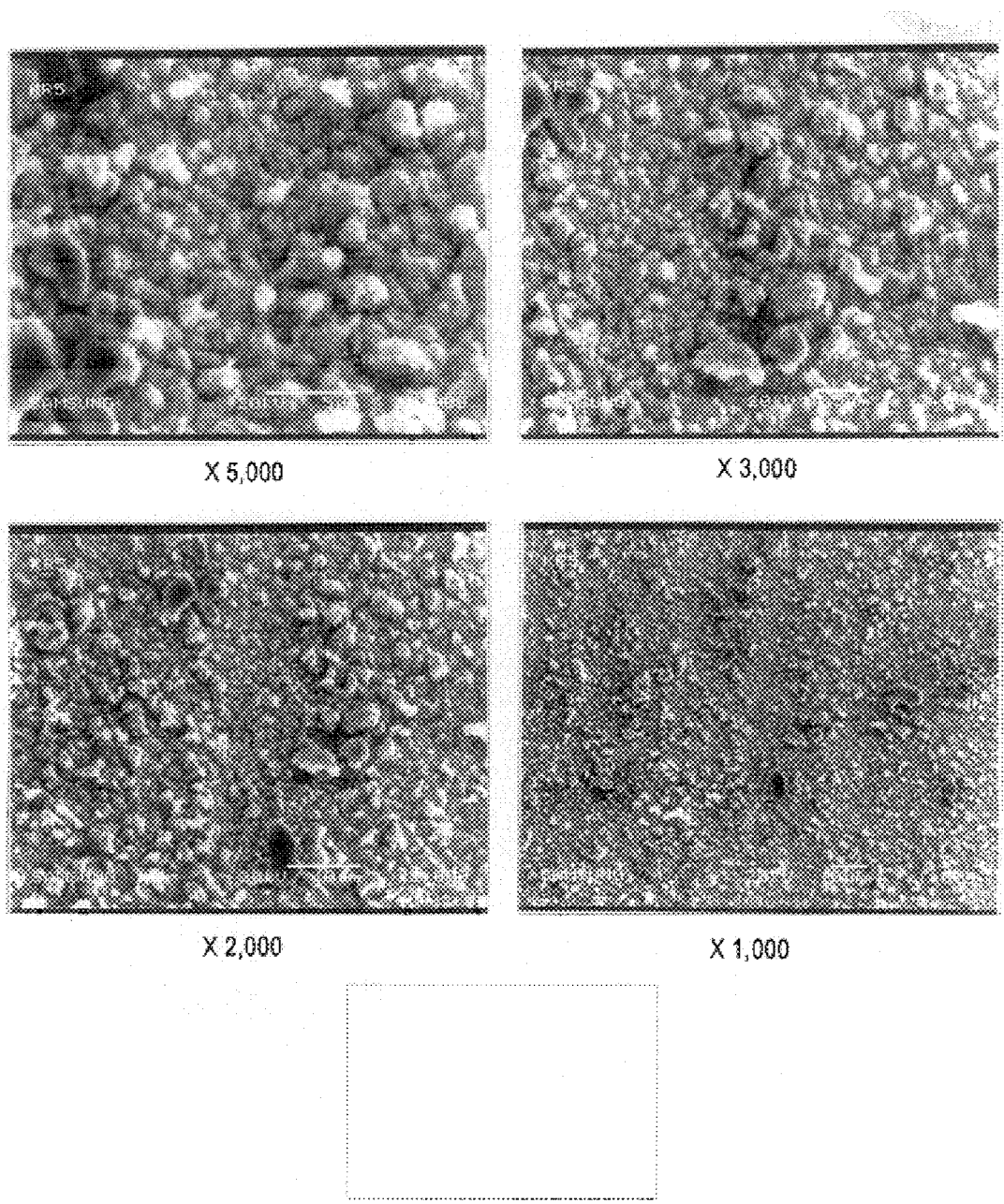

The results are given in FIG. 2. As seen in FIG. 2, the blackish brown oxide films formed according to the present invention are so resistant to chemicals that they cannot be damaged even if being immersed in 98% sulfuric acid or 35% hydrochloric acid.

EXAMPLE VII

Samples were pre-dipped at 20–30° C. for 1 min in the pre-dip composition prepared in Example I (KA-1) and then, subjected to conversion coating treatment. The conversion coating treatment was conducted twice at 40° C. using the conversion coating composition prepared in Example III. In the first conversion coating round, the samples were treated for 2 min, 2.5 min, 3 min and 4 min. In the second round, the treatment period was changed to 2 min, 2.5 min, 3 min, 3.5 min, 4 min and 5 min. The composition was not stirred in the first round, but stirred in the second round at a speed of 1 m/s. The test results are shown in FIGS. 3a to 3j magnification, ×5000, ×3000, ×2000, ×1000). Printed circuit boards on which the blackish brown oxide films were formed according to the present invention were found to show excellent surface in roughness.

EXAMPLE VIII

Printed circuit boards prepared according to the conversion coating method of the present invention were assayed for environmental conditions.

Samples were washed at 50° C. for 305 min with 5% HD250™, pre-dipped at 40–50° C. for 1 min in the pre-dip composition of Example I, and subjected to conversion coating treatment at 40° C. for 3 min using the conversion coating composition of Example III. The other necessary processes were conducted as described in Example I.

According to JIS test standards, a thermal stress-solder test, an air-to-air thermal cycle test, a liquid-to-liquid thermal shock test, and a high temperature & humidity test were performed. The samples were found to meet with the physical properties required in the JIS test standards.

As described hereinbefore, the conversion coating composition and the conversion coating method according to the present invention can conduct a blackening process at lower temperatures for shorter periods of time with a simpler procedure compared with conventional blackening processes. In addition, the black oxide films obtained as a result of the blackening process of the present invention are superior in acid resistance and adhesive strength, improving the reliability of the PCB. Further, because the method of the present invention does not require a reducing process, which consumes highly expensive reducing chemicals, and reduces the amount of waste water by 50% compared with conventional techniques, the present invention is favorable economically and environmentally.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A conversion coating composition, comprising: based on the composition,
   0.1–30% by volume of sulfuric acid;
   0.1–15% by volume of hydrogen peroxide;
   0.01–10% by weight of an organic acid;
   0.1–30% by weight of a nitrogen compound;
   0.01–10% by weight of an organic silicate and or an organic titanate; and at least one additive selected from the group consisting of a film forming auxiliary, an etching rate controller, a reaction promoter and a stabilizer, and wherein the organic acid comprises at least one selected from the group consisting of (i) acetic acid, (ii) propionic acid, (iii) glycolic acid, (iv) citric acid, (v) taric acid, (vi) maleic acid, (vii) malonic acid, (viii) succinic acid, (ix) phthaic acid, (x) benzoic acid, (xi) acrylic acid, and (xii) anhydride of acetic acid, propionic acid, glycolic acid, citric acid, tartaric acid, maleic acid, malonic acid, succinic acid, phthalic acid, benzoic acid, and acrylic acid, wherein the film forming auxiliary comprises at least one selected from the group consisting of (i) hydroquinone, (ii) resorcinol, (iii) pyrocatechol, (iv) pyrogallol, (v) derivatives of hydroquinone, resorcinol, pyrocatechol, and pyrogallol, and (vi) organic sulfur compounds, in an amount of 0.1–20% by weight, if present, based on the weight of the conversion coating composition, wherein the etching rate controller comprises at least one selected from the group consisting of N-methyl-2-pyrrolidone, N-cyclohexyl-2-pyrrolidone, 2-pyrrolidone, dimethyl formamide, dimethyl acetamide, tetrahydrofuran, acetonitrile, dioxane, all lactate, alkyl glycolate, alkyl phosphate, ketone, alcohol, and combinations thereof, in an amount of 0.1–30% by weight, if present, based on the weight of the composition coating composition, wherein the reaction promoter comprises at least one selected from the group consisting of ammonium peroxysulfate, sodium peroxysulfate, potassium peroxysulfate, sodium peroxymonosulfate, potassium peroxymonosulfate, nitric acid, sodium nitrate, potassium nitrate, ammonium nitrate, phosphoric acid, phosphates, ferric nitrate, ferric sulfate, ferric citrate, and mixtures thereof, in all amount of 0.1–20% by weight, if present, based on the weight of the conversion coating composition, and wherein the stabilizer comprises a chelating agent selected from the group consisting of (i) nitrilotriacetic acid (NTA), (ii) EDTA, (iii) DPTA, and (iv) metal salts of NTA, EDTA and DPTA, in an amount of 0.1–20 g/l based on the volume of the conversion coating composition.

2. The composition as set forth in claim 1, wherein the sulfuric acid is present in an amount of 1.0–15% by volume based on the volume of the conversion coating composition.

3. The composition as set forth in claim 1, wherein the hydrogen peroxide is present in an amount of 1.0–10% by volume based on the volume of the conversion coating composition.

4. The composition as set forth in claim 1, wherein the organic acid is present in an amount of 0.01–5% by weight based on the weight of the conversion coating composition.

5. The composition as set forth in claim 4, wherein the organic acid is present in an amount of 0.05–2.5% by weight based on the weight of the conversion coating composition.

6. The composition as set forth in claim 1, wherein the nitrogen compound is present in an amount of 0.1–20% by weight based on the weight of the conversion coating composition.

7. The composition as set forth in claim 6, wherein the nitrogen compound is present in an amount of 0.5–15% by weight based on the weight of the conversion coating composition.

8. The composition as set forth in claim 1, wherein the organic silicate and/or the organic titanate is present in an amount of 0.1–15% by weight based on the weight of the conversion coating composition.

9. The composition as set forth in claim 1, wherein the film forming auxiliary is present in an amount of 0.1–15% by weight based on the weight of the conversion coating composition.

10. The composition as set forth in claim 9, wherein the film forming auxiliary is present in an amount of 0.5–10% by weight based on the weight of the conversion coating composition.

11. The composition as set forth in claim 1, wherein the etching rate controller is present in an amount of 0.1–20% by weight based on the weight of the conversion coating composition.

12. The composition as set forth in claim 11, wherein the etching rate controller is present in an amount of 0.5–10% by weight based on the weight of the conversion coating composition.

13. The composition as set forth in claim 1, wherein the reaction promoter is present in an amount of 0.1–15% by weight based on the weight of the conversion coating composition.

14. The composition as set forth in claim 13, wherein the reaction promoter is present in an amount of 0.5–10% by weight based on the weight of the conversion coating composition.

15. The composition as set forth in claim 1, wherein the stabilizer is present in an amount of 0.5–5 g/l based on the volume of the conversion coating composition.

16. The composition as set forth in claim 1, wherein the nitrogen compound is selected from the group consisting of urea, thio-urea, derivatives of urea, derivatives of thio-urea, imidazole, triazole, thiazole, derivatives of imidazole, derivatives of triazole, derivatives of thiazole, compounds containing active nitrogen in form of =NH, compounds containing active nitrogen in form of —N=, compounds containing active nitrogen in form of =NOH, compounds containing active nitrogen in form of —N=N—, compounds containing active nitrogen in form of =N—S—N=, and mixtures thereof.

17. The composition as set forth in claim 1, wherein the organic silicate is an organic silane compound containing an —Si—O— group, and tile organic titanate contains a —Ti—O— group.

18. The composition as set forth in claim 17, wherein the organic silicate and/or organic titanate is selected from the group consisting of $RSi(OR)_3$, $RSi(OROR)_3$, $Ti(OC_3H_7)_4$, $N(CH_2CH_2O)_3TiOC_3H_7$ and combinations thereof, wherein R is alkyl, vinyl, benzyl, or acetyl.

19. A method for forming a conversion coating film on a printed circuit board, comprising the steps of:

(a) cleaning and rinsing a copper or a copper alloy printed circuit board;

(b) applying to the printed circuit board a conversion coating composition comprising:
based on the composition,
0.1–30% by volume of sulfuric acid;
0.1–1 5% by volume of hydrogen peroxide;
0.01–10% by weight of an organic acid;
0.1–30% by weight of a nitrogen compound;
0.01–10% by weight of an organic silicate and/or an organic titanate; and
at least one additive selected from the group consisting of a film forming auxiliary, an etching rate controller, a reaction promoter and a stabilizer, and wherein the organic acid comprises at least one selected from the group consisting of (i) acetic acid, (ii) propionic acid, (iii) glycolic acid, (iv) citric acid, (v) tartaric acid, (vi) maleic acid, (vii) malonic acid, (viii) succinic acid, (ix) phthalic acid, (x) benzoic acid, (xi) acrylic acid, and (xii) anhydride of acetic acid, propionic acid, glycolic acid, citric acid, tartaric acid, maleic acid, malonic acid, succinic acid, phthalic acid, benzoic acid, and acrylic acid, wherein the film forming auxiliary comprises at least one selected from the group consisting of (i) hydroquinone, (ii) resorcinol, (iii) pyrocatechol, (iv) pyrogallol, (v) derivatives of hydroquinone, resorcinol, pyrocatechol, and pyrogallol, and (vi) organic sulfur compounds, in an amount of 0.1–20% by weight, if present, based on the weight of the conversion coating composition, wherein the etching rate controller comprises at least one selected from the group consisting of N-methyl-2-pyrrolidone, N-cyclohexyl-2-pyrrolidone, 2-pyrrolidone, dimethyl formamide, dimetlyl acetamide, tetrahydrofuran, acetonitrile, dioxane, alkyl lactate, alkyl glycolate, alkyl phosphate, ketone, alcohol, and combinations thereof, in an amount of 0.1–30% by weight, if present, based on the weight of the composition coating composition, wherein the reaction promoter comprises at least one selected from the group consisting of ammonium peroxysulfate, sodium peroxysulfate, potassium peroxysulfate, sodium peroxymonosulfate, potassium peroxymonosulfate, nitric acid, sodium nitrate, potassium nitrate, ammonium nitrate, phosphoric acid, phosphates, ferric nitrate, ferric sulfate, ferric citrate, and mixtures thereof, in an amount of 0.1–20% by weight, if present, based on the weight of the conversion coating composition, and wherein the stabilizer comprises a chelating agent selected from the group consisting of (i) nitrilotriacetic acid (NTA), (ii) EDTA, (iii) DPTA, and (iv) metal salts of NTA, EDTA and DPTA, in an amount of 0.1–20 g/l based on the volume of the conversion coating composition; and (c) cleaning and drying the printed circuit board.

20. The method as set forth in claim 19, wherein the applying step is conducted at 30–50° C. for 2–5 min.

21. The method as set forth in claim 19, further comprising the step of pre-dipping the printed circuit board in a pre-dip composition comprising, 0.1–5.0% by volume of sulfuric acid; 0.1–10.0% by volume of hydrogen peroxide; 0.01–10% by weight of an organic acid; 0.1–30% by weight of a nitrogen compound; 0.01–10% by weight of an organic silicate and/or an organic titanate; and 0.1–20% by weight of a reaction promoter and/or 0.1–20 g/l of a stabilizer at 10–60° C. for 10 sec-10 min after the cleaning and rinsing step.

22. The method as set forth in claim 21, wherein the sulfuric acid is present in an amount of 0.1–1.0% by volume based on the volume of the pre-dip composition.

23. The method as set forth in claim 21 wherein the hydrogen peroxide is present in an amount of 1.0–5.0% by volume based on the volume of the pre-dip composition.

* * * * *